(12) United States Patent
Mahant Shetti et al.

(10) Patent No.: US 9,755,642 B2
(45) Date of Patent: Sep. 5, 2017

(54) LOW COST CMOS CHIP WITH TAPE AUTOMATED BONDING (POLYAMIDE)

(71) Applicant: Shivaling Shrishail Mahant Shetti, Belgaum (IN)

(72) Inventors: Shivaling Shrishail Mahant Shetti, Belgaum (IN); Anand Baligatti, Belgaum (IN); Prakash Donur, Bijapur (IN); Veeranna Hooli, Belgaum (IN); Ranganath Y Goudar, Bagalkot (IN); Anil Agasar, Bagalkot (IN); Manjunathreddi G Baragundi, Dharwad (IN)

( * ) Notice: Subject to any disclaimer, the term of this patent is extended or adjusted under 35 U.S.C. 154(b) by 0 days.

(21) Appl. No.: 14/962,157

(22) Filed: Dec. 8, 2015

(65) Prior Publication Data

US 2016/0164524 A1    Jun. 9, 2016

(30) Foreign Application Priority Data

Dec. 8, 2014 (IN) ............................. 6200/CHE/2014

(51) Int. Cl.
*H03K 19/018*    (2006.01)
*H03K 19/0185*   (2006.01)

(52) U.S. Cl.
CPC .............. *H03K 19/018521* (2013.01); *H03K 19/018585* (2013.01)

(58) Field of Classification Search
CPC ............. H01L 27/0623; H01L 27/0922; H01L 21/8234; H01L 21/8249; H01L 27/0207; H01L 29/456; H01L 29/665
USPC ..................... 327/108, 109, 111, 112; 326/80
See application file for complete search history.

(56) References Cited

U.S. PATENT DOCUMENTS

2008/0079461 A1*  4/2008  Lin ................... H01L 21/76816
                                                                326/80

\* cited by examiner

*Primary Examiner* — John Poos
(74) *Attorney, Agent, or Firm* — The Law Office of Austin Bonderer, PC; Austin Bonderer

(57) ABSTRACT

In view of the foregoing, an embodiment herein provides a low cost system. The system includes a bipolar array, a CMOS chip. The bipolar array includes one or more bipolar integrated circuits. The CMOS chip is programmed by a single level of metal. The bipolar array and the CMOS chip is mounted on a substrate using TAB polyamide. The TAB includes a polyamide film with one or more metal patterns chemically etched by programming three metal layers simultaneously to obtain one or more components. The one or more components are mounted in a package, and a small system can be realized. An external capacitor supplies an ac power source to the bipolar array. The bipolar array produces a rectified voltage and a lower voltage power for the enhanced gate array. An output of the enhanced gate array drives bipolar drivers of DC motor, stepper motor, BLDC motor, and LED assemblies.

10 Claims, 2 Drawing Sheets

LOW COST CMOS CHIP WITH TAPE AUTOMATED BONDING (POLYAMIDE)

CROSS-REFERENCE TO RELATED APPLICATIONS

This application claims priority to Indian patent application no. 6200/CHE/2014 filed on Dec. 8, 2014, the complete disclosure of which, in its entirely, is herein incorporated by reference.

BACKGROUND

Technical Field

The embodiments herein generally relate to a frugal small System in Package (SIP) devices to promote energy and water conservation, and, more particularly, provide amenities to rural communities efficiently thereby alleviating rural urban migration. The system use a complementary metal oxide semiconductor (CMOS) chip along with a Bipolar chip in a package with tape automated bonding (polyamide), and other methods of packaging may also be used.

Description of the Related Art

An increasing demand for energy and water has resulted in more efficient energy and water production, transmission and distribution. Excess energy and water generation have negative environmental impact. An additional environmentally friendly solution to energy and water problems is to use energy and water more efficiently. Unlike generation, conservation approach requires a distributed approach. Further, it is known that large amounts of energy and water are used in motors either for agriculture or fan uses and the approach these can provide as much as 30% to 40% improvement in energy use. Semiconductors are a natural solution to deal with such problems with the advantage of scales demonstrated.

Simultaneously, Rural to Urban migration fueled by better infrastructure in urban centers is another big economic challenge to nations and the approach here can help provide improved access to energy and water and thus mitigating the problem. In a village power supply is intermittent. The buildup of a present day typical system with printed circuit board and power supplies is expensive. As the number of these functionalities increases, however, so does the number of components on a single integrated circuit chip. Accordingly, there remains need for low cost semiconductor system solutions to address problems such as energy conservation in an efficient manner. The low cost semiconductor system is an infrastructure solution and as such if the system can be manufactured locally is helpful.

SUMMARY

In view of the foregoing, an embodiment herein provides a low cost system for driving bipolar drivers. The system includes a bipolar array, a CMOS chip, a plurality of external capacitors, and a plurality of external high power or high precision resistors that cannot be implemented on chip. The bipolar array includes one or more bipolar integrated circuits (IC). The one or more bipolar ICs are programmed with a single level metal. The CMOS chip is programmed by a single level of metal to communicate with the bipolar array to obtain a plurality of small systems. The bipolar array and the CMOS chip is mounted on a substrate using a tape automated bonding (TAB polyamide). The TAB includes a polyamide film with one or more metal patterns chemically etched. By programming a metal layer each simultaneously, i.e. in the bipolar chip, in the CMOS chip and on the TAB to obtain one or more components. The one or more components are mounted in a package, and a small system can be realized. In one implementation, the series impedance of high voltage external capacitor supplies an ac power source to the bipolar array. The bipolar array produces a rectified voltage and a lower voltage power for the enhanced gate array includes at least one of, but not limited to (i) cascade circuits, (ii) current drive circuits, (iii) analog circuits, (iv) digital circuit, (v) RF circuit, and (vi) current driven circuit. An output of the enhanced gate array drives bipolar drivers of DC motor, stepper motor, BLDC motor, and LED assemblies.

In one embodiment, the power is generated using a full feedback based regulator with high current bipolar device and a zener diode to provide a voltage reference. In another embodiment, the one or more components are (i) a CMOS metal, (ii) a Bipolar metal, and (iii) a TAB metal. In yet another embodiment, the one or more external capacitors includes at least one of a high voltage capacitor, or a low voltage capacitor to produce filtered supply. In yet another embodiment, the bipolar integrated chip is associated with at least one of: (i) power supply components, (ii) voltage regulator, (iii) a pull down driver for devices, and (iv) a high current emitter follower. In yet another embodiment, the tape automated bonding polyamide with the bipolar array, and the CMOS chip is mounted in a DIP package or directly on a printed circuit board (PCB).

In another aspect, a low cost system for driving bipolar drivers is provided. The system includes a bipolar array, a CMOS chip, a plurality of external capacitors, and a plurality of external high power or high precision resistors. The bipolar array includes one or more bipolar integrated circuits (IC). The one or more bipolar ICs are programmed with a single level metal. The CMOS chip is programmed by a single level of metal to communicate with the bipolar array to obtain one or more small systems. The bipolar array and the CMOS chip is mounted on an IC substrate using a tape automated bonding (TAB polyamide). The TAB includes a polyamide film with one or more metal patterns chemically etched. By programming a metal layer each simultaneously, i.e. in the bipolar chip, in the CMOS chip and on the TAB to obtain one or more components. The one or more components are mounted in a package, and a small system can be realized. The tape automated bonding polyamide with the bipolar array, and the CMOS chip is mounted in a DIP package or directly on a printed circuit board (PCB). The CMOS chip includes one or more enhanced gate array. In one implementation, the series impedance of high voltage external capacitor supplies an ac power source to the bipolar array. The bipolar array produces a rectified voltage and a lower voltage power for the enhanced gate array includes at least one of, but not limited to (i) cascade circuits, (ii) current drive circuits, (iii) analog circuits, (iv) digital circuit, (v) RF circuit, and (vi) current driven circuit. An output of the enhanced gate array drives bipolar drivers of DC motor, stepper motor, BLDC motor, and LED assemblies. The power is generated using a full wave rectifier and a regulator with high current bipolar device and a zener diode to provide a voltage reference.

In one embodiment, the enhanced gate array perform at least one of, but not limited to (i) analog circuit, (ii) digital circuit, (iii) cascade circuits, (iv) current drive circuits, (v) RF circuit, and (vi) current driven circuit. In another embodiment, the bipolar integrated chip is associated with at least one of: (i) power supply component, (ii) voltage regulator, (iii) a pull down driver for devices, and (iv) a high current emitter follower. In yet another embodiment, the bipolar array includes one or more sensors without increasing an area of the bipolar array.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 1:
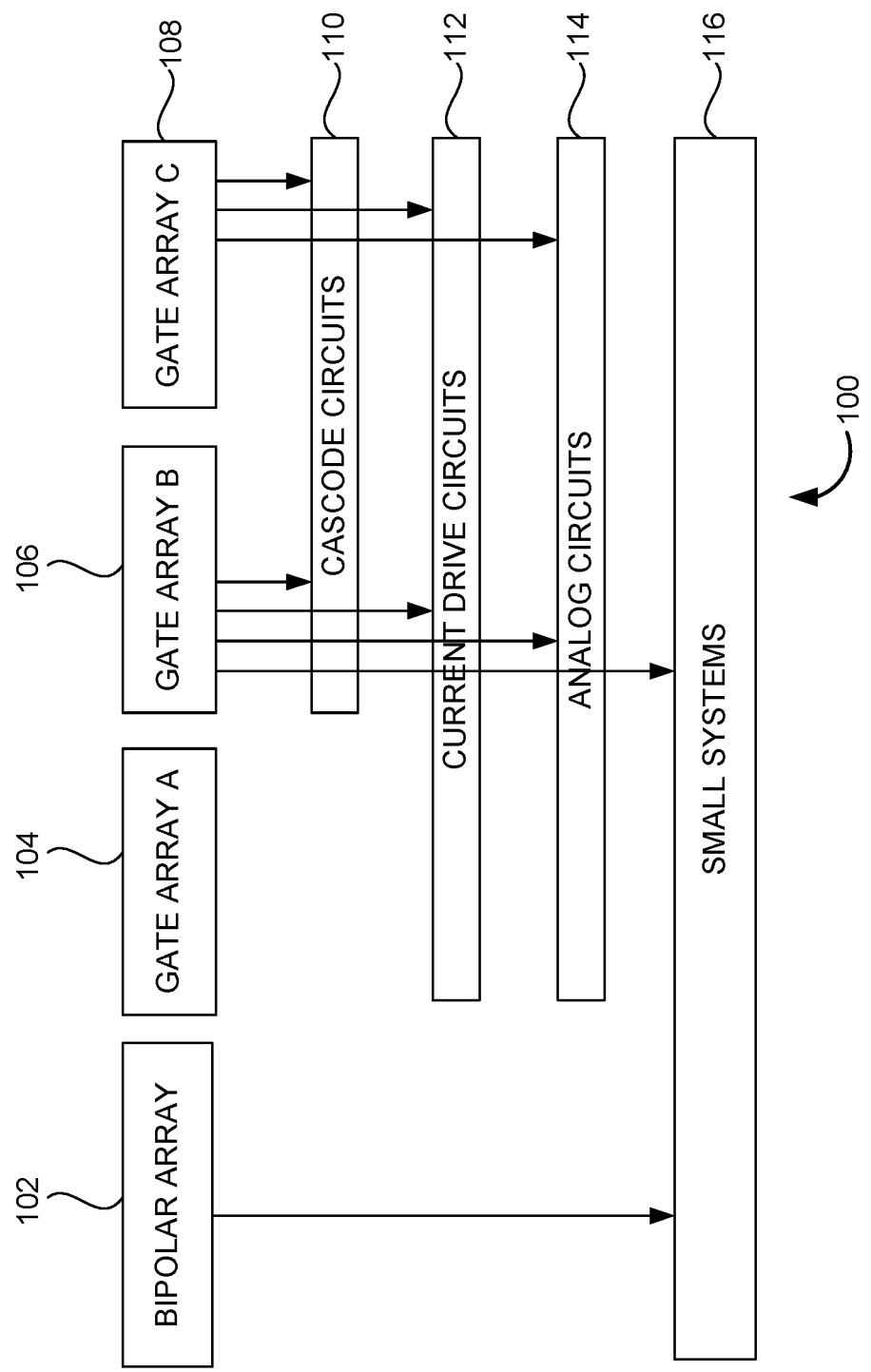
FIG. 1 illustrates a block diagram of complementary metal oxide semiconductor chip with tape automated bonding polyamide for large scale power consumption according to an embodiment herein.
Figure 2:
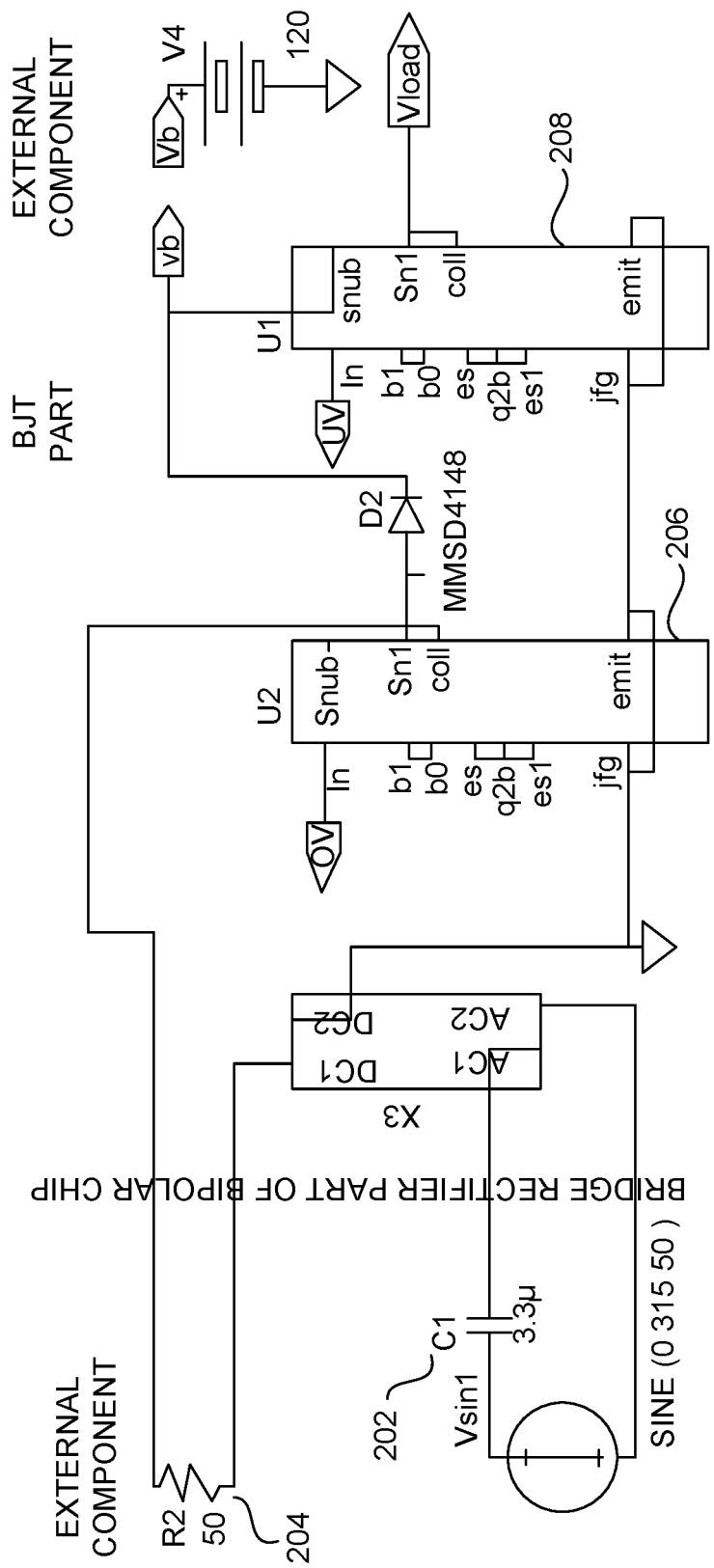
FIG. 2 illustrates a circuit diagram of a power supply system according to an embodiment herein.

As mentioned, there remains need for low cost consuming semiconductor system (a low cost small system) solutions to address problems such as energy conservation in an efficient manner, and efficiently driving bipolar drivers of DC motor, stepper motor, BLDC motor, and LED assemblies. A low cost small system can make energy available when needed, and helps to conserve energy by eliminating wastage. Water is at a premium and such small systems can help use water optimally. For wide scale adoption of the techniques, the low cost small system need to frugal and prove that they can save sufficient energy and/or water in a short time to justify their installation. The low cost small system with complementary metal oxide semiconductor (CMOS) chip with tape automated bonding polyamide is provided to reduce cost of a system to (i) monitor energy consumption in large scale applications, and (ii) drives bipolar drivers. Referring now to the drawings, and more particularly to FIGS. 1 through 2, where similar reference characters denote corresponding features consistently throughout the figures, there are shown preferred embodiments.

FIG. 1 illustrates a block diagram of complementary metal oxide semiconductor chip with tape automated bonding polyamide for large scale power consumption according to an embodiment herein. The complementary metal oxide semiconductor (CMOS) chip with tape automated bonding polyamide in which a bipolar circuit which provides a) a power supply components, b) a voltage regulator function, and c) a driver for devices. For example, as DC motor, stepper motors, brushless DC (BLDC) motors, and LED assemblies. The block diagram 100 includes a bipolar array 102, one or more enhanced gate array (i.e. an enhanced gate array A 104 (e.g., 2 um gate array), an enhanced gate array B 106 (e.g., a 0.7 um gate array), an enhanced gate array C 108 (e.g., 0.35 um gate array)), a cascade circuit 110, a current drive circuit 112, an analog circuit 114, and a small system 116. The bipolar array 102 includes a plurality of bipolar integrated circuits (IC). The plurality of bipolar integrated circuits (IC) is programmed with a single level metal. An tape automated bonding (TAB) polyamide or similar substrate includes a high voltage/high current bipolar integrated chip with minimal cost and a CMOS chip also of low cost. Specifically, the CMOS chip includes a CMOS gate array that can be programmed using a single level of metal (i.e. metal pattern). In one embodiment, the bipolar chip is a single level metal programmable chip.

The bipolar array 102 and the CMOS chip is mounted on a substrate using a tape automated bonding (TAB polyamide). The TAB includes a polyamide film with one or more metal patterns chemically etched. By programming a metal layer each simultaneously, i.e. in the bipolar chip, in the CMOS chip and on the TAB to obtain one or more components. The one or more components are (i) a CMOS metal, (ii) a bipolar metal, and (iii) a TAB metal. The overall combination may fit in the cavity of a present chip or amenable to direct bonding to a minimal PCB (Printed circuit board), or a DIP package. In one embodiment, the CMOS chip that is programmed by a single level of metal to communicate with the bipolar array 102 to obtain a plurality of small systems. In one embodiment, the CMOS integrated circuit perform reasonable complexity functions at least one of as serial interface, decoding and sequential/arithmetic circuits.

The AC power may therefore be applied through external passive components such as a capacitor to the bipolar chip which would produce rectified output useful for the load. By providing same DC as an input, a simple regulated power supply of approximately five volts is generated using either a full feedback based regulator with high current bipolar device and a zener to provide a voltage reference. In one embodiment, the regulated power supply is generated using a full wave rectifier and a regulator with high current bipolar device. In another embodiment, a bridge rectifier on bipolar chip with a current limiting capacitor produces a power supply DC voltage to the CMOS chip. In one embodiment, the capacitor may be high voltage capacitor, or low voltage capacitor to produce filtered supply. In one embodiment, one or more external high power or high precision resistors are used in the power supply components to limit the high current flow.

In one embodiment, operating with the simple power supply the CMOS chip may perform required functions using cascade circuits, current drive circuits, analog circuits, digital circuit, RF circuit, and current driven circuit. The output from the CMOS chip may be used to drive bipolar drivers of Dc motor, stepper motor, BLDC motor, and LED assemblies. In another embodiment, the one or more enhanced gate array of the CMOS chip includes at least one of, but not limited to (i) cascade circuits, (ii) current drive circuits, (iii) analog circuits, (iv) digital circuit, (v) RF circuit, and (vi) current driven circuit. The bipolar integrated chip is associated with the bipolar circuits. In one embodiment, the bipolar circuits may be (i) power supply component, (ii) voltage regulator, (iii) a pull down driver for devices such as (a) DC motor, (b) stepper motors, (c) BLDC motors, and (d) LED assemblies, and (iv) a high current emitter follower, etc.

In another embodiment, one or more parts of a circuit which requires error amplification may be constructed in the CMOS part and reference diodes are used from bipolar parts. In one embodiment, the enhanced gate array of the CMOS chip may act as error amplification circuit.

For example, considering a design of a stepper motor driver. An input pulse and control resides in the CMOS chip which may provide sequencing and pulse width modulation and a bipolar junction transistor (BJT) may drive the stepper motor.

FIG. 2 illustrates a circuit diagram of a power supply system according to an embodiment herein. The power supply system includes a capacitor 202, a high power or high precision resistor 204, a first bipolar transistor 206, and a second bipolar transistor 208. The bipolar transistors (i.e. the first bipolar transistor 206 and the second bipolar transistor 208) are connected in a Darlington pair. The capacitor 202 supplies an ac power source to the bipolar array 102. In one embodiment, the series impedance of high voltage capacitor supplies an ac power source. In one embodiment, the capacitor 202 may be high voltage capacitor, or low voltage capacitor to produce filtered ac supply. In another embodiment, one or more capacitors in the power supply system supply the ac power source to the bipolar array 102. The high power or high precision resistor 204 limits an input current flow of the bipolar array 102. In an embodiment, one or more high power or high precision resistors limit an input current flow of the bipolar array 102. A full wave rectifier and a regulator of a bipolar array 102 generate a power supply DC voltage which is required for the CMOS chip. The generated power supply DC voltage is given to the CMOS chip to perform one or more functions using at least one of, but not limited to (a) cascade circuits, (b) current drive circuits, (c) analog circuits, (d) digital circuit, (e) RF circuit, and (f) current driven circuit, and the output of the CMOS chip drives bipolar drivers of DC motor, stepper motor, BLDC motor, and LED assemblies. In one embodiment, the Darlington blocks using control signals in CMOS chip produce the overvoltage and under voltage functions.

Requirement of low cost systems is provided for large scale use leading to better conservation of energy. This low cost system supports in multiple cost reductions for monitoring the energy consumption at large scale applications. Incorporating a power source in the overall system cost is a less. This physical configuration which addresses the system implementation in cost vice is overall reduced.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:
1. A low cost system comprising:
  a bipolar array (102), wherein said bipolar array (102) comprises a plurality of bipolar integrated circuits (IC), wherein said plurality of bipolar IC is programmed with a single level metal;
  a plurality of enhanced gate arrays (104, 106 and 108), wherein said plurality of enhanced gate arrays (104, 106 and 108) of a CMOS chip is programmed by a single level of metal to communicate with said bipolar array (102) to obtain a plurality of small systems, wherein said bipolar array (102) and said CMOS chip are mounted on a substrate using a tape automated bonding (TAB) polyamide, wherein said TAB comprises a polyamide film with one or more metal patterns chemically etched, wherein by programming three metal layers simultaneously in said plurality of bipolar IC, in said CMOS chip, and on said TAB to obtain one or more components, wherein said one or more components are mounted in a package, and a small system can be realized;
  a capacitor (202); and
  a high power or high precision resistor (204), wherein said series impedance of said capacitor (202) supplies an ac power source to said bipolar array (102), wherein said bipolar array (102) produces a rectified voltage and a lower voltage power for said plurality of enhanced gate arrays (104, 106 and 108) comprising at least one of, but not limited to (i) cascade circuits, (ii) current drive circuits, (iii) analog circuits, (iv) digital circuit, (v) RF circuit, and (vi) current driven circuit,
wherein an output of said plurality of enhanced gate arrays (104, 106 and 108) drive bipolar drivers of DC motor, stepper motor, BLDC motor, and LED assemblies.

2. The low cost system of claim 1, wherein said power is generated using a full feedback based regulator with high current bipolar device and a zener diode to provide a voltage reference.

3. The low cost system of claim 1, wherein said one or more components are (i) a CMOS metal, (ii) a Bipolar metal, and (iii) a TAB metal.

4. The low cost system of claim 1, wherein said capacitor (202) comprises at least one of a high voltage capacitor, or a low voltage capacitor to produce filtered supply.

5. The low cost system of claim 1, wherein said plurality of bipolar integrated circuits is associated with at least one of: (i) power supply components, (ii) voltage regulator, (iii) a pull down driver for devices, and (iv) a high current emitter follower.

6. The low cost system of claim 1, wherein said tape automated bonding polyamide with said bipolar array (102), and said CMOS chip is mounted in a DIP package or directly on a printed circuit board (PCB).

7. A low cost system comprising:
  a bipolar array (102), wherein said bipolar array (102) comprises plurality of bipolar integrated circuits (IC), wherein said plurality of bipolar IC is programmed with a single level metal;
  a plurality of enhanced gate arrays (104, 106 and 108), wherein said plurality of enhanced gate arrays (104, 106 and 108) of a CMOS chip is programmed by a single level of metal to communicate with said bipolar array (102) to obtain a plurality of small systems, wherein said bipolar array (102) and said CMOS chip are mounted on a IC substrate using a tape automated bonding (TAB) polyamide, wherein said TAB comprises a polyamide film with one or more metal patterns chemically etched, wherein by programming three metal layers simultaneously in said plurality of bipolar IC, in said CMOS chip, and on said TAB to obtain one or more components, wherein said one or more components are mounted in a package, and a small system can be realized, wherein said tape automated bonding polyamide with said bipolar array (102), and said CMOS chip is mounted in a DIP package or directly on a printed circuit board (PCB);

a capacitor (202); and a high power or high precision resistor (204), wherein said series impedance of said capacitor (202) supplies an ac power source to said bipolar array (102), wherein said bipolar array (102) produces a rectified voltage and a lower voltage power for said plurality of enhanced gate arrays (104, 106 and 108) comprising at least one of, but not limited to (i) cascade circuits, (ii) current drive circuits, (iii) analog circuits, (iv) digital circuit, (v) RF circuit, and (vi) current driven circuit, wherein an output of said plurality of enhanced gate arrays (104, 106 and 108) drive bipolar drivers of DC motor, stepper motor, BLDC motor, and LED assemblies, wherein a power is generated using a full wave rectifier and a regulator with high current bipolar device and a zener diode to provide a voltage reference.

8. The low cost system of claim 7, wherein said plurality of enhanced gate arrays (104, 106 and 108) perform at least one of, but not limited to (i) analog circuit, (ii) digital circuit, (iii) cascade circuits, (iv) current drive circuits, (v) RF circuit, and (vi) current driven circuit.

9. The low cost system of claim 7, wherein said plurality of bipolar integrated circuits is associated with at least one of: (i) power supply component, (ii) voltage regulator, (iii) a pull down driver for devices, and (iv) a high current emitter follower.

10. The low cost system of claim 7, wherein said bipolar array (102) comprises a plurality of sensors without increasing an area of said bipolar array (102).

* * * * *